(12) United States Patent
Lee et al.

(10) Patent No.: US 9,224,988 B2
(45) Date of Patent: Dec. 29, 2015

(54) METHOD FOR MANUFACTURING DISPLAY DEVICE

(71) Applicant: Samsung Display Co., Ltd., Yongin, Gyeonggi-Do (KR)

(72) Inventors: Dong-Min Lee, Yongin (KR); Young-Sik Yoon, Yongin (KR); Chang-Mo Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 52 days.

(21) Appl. No.: 14/085,021

(22) Filed: Nov. 20, 2013

(65) Prior Publication Data

US 2014/0141545 A1    May 22, 2014

(30) Foreign Application Priority Data

Nov. 20, 2012    (KR) .................. 10-2012-0132002

(51) Int. Cl.
*H01L 21/30*    (2006.01)
*H01L 51/56*    (2006.01)
*H01L 51/00*    (2006.01)
*H01L 27/12*    (2006.01)

(52) U.S. Cl.
CPC ............ *H01L 51/56* (2013.01); *H01L 27/1266* (2013.01); *H01L 51/003* (2013.01); *H01L 2227/326* (2013.01)

(58) Field of Classification Search
CPC .............. H01L 51/003; H01L 27/1266; H01L 2227/323; H01L 2227/326
USPC ..................... 438/34, 458; 257/72, E51.022
See application file for complete search history.

(56) References Cited

U.S. PATENT DOCUMENTS

| 2005/0156239 A1* | 7/2005 | Seko et al. ................. 257/347 |
| 2008/0088322 A1* | 4/2008 | Nagai ....................... 324/671 |
| 2010/0197127 A1* | 8/2010 | Urano ....................... 438/584 |
| 2012/0156457 A1* | 6/2012 | Kondo ....................... 428/215 |

FOREIGN PATENT DOCUMENTS

| JP | 2000-273303 | 10/2000 |
| JP | 2003-236819 | 8/2003 |
| KR | 10-2012-0018798 | 3/2012 |
| KR | 10-2012-0023063 | 3/2012 |

OTHER PUBLICATIONS

Arkles et al., "Factors contributing to the stability of alkoxysilanes in aqueous solution", 1992, Silanes and Other Coupling Agents, Ed. K. L. Mittal, pp. 91-104.*

* cited by examiner

*Primary Examiner* — Kimberly Rizkallah
*Assistant Examiner* — Maria Ligai
(74) *Attorney, Agent, or Firm* — Robert E. Bushnell, Esq.

(57) ABSTRACT

A method for manufacturing a display device includes: forming a deformed layer on a support substrate by a silane coupling agent; performing UV treatment on the deformed layer; forming a thin film substrate on the deformed layer; forming a pixel and an encapsulation member on the thin film substrate; and separating the support substrate from the thin film substrate.

15 Claims, 17 Drawing Sheets

METHOD FOR MANUFACTURING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 20 Nov. 2012 and there duly assigned Serial No. 10-2012-0132002.

BACKGROUND OF THE INVENTION

1. Field of the Invention

An embodiment of the present invention relates generally to a method for manufacturing a display device, and more particularly, to a method for manufacturing a display device which prevents damage to a thin film transistor upon separating a polymer substrate or ultrathin glass substrate from a support substrate, lowers processing costs, and can separate them from each other within a short time.

2. Description of the Related Art

The recent market for display devices is changing rapidly, focusing on flat panel display devices (FPDs) capable of achieving a large area and a thin and lightweight profile. Among a variety of flat panel display devices, an organic light emitting diode display device is more advantageous in being thin and lightweight because it is a self-luminous type requiring no light source.

A typical flat panel display device has a limitation in the range of application due to low flexibility because it uses a glass substrate. In this regard, flexible display devices have been recently developed which are configured to be bent using a polymer substrate, instead of a glass substrate. Moreover, a display device is being developed that has a display section formed on an ultrathin glass substrate in order to reduce the thickness of the display device.

A process of fabricating and handling a thin film transistor on a polymer substrate or ultrathin glass substrate is a core process in fabricating a flexible display panel. However, there are many difficulties in the process of manufacturing a display device by applying a thin and bendable polymer substrate or ultrathin glass substrate as a substitute in a manufacturing facility configured to be suitable for a conventional glass substrate.

In this regard, a process of attaching a polymer substrate or ultrathin glass substrate on a support substrate having the same rigidity as a glass substrate, forming a thin film transistor, and then separating the polymer substrate or ultrathin glass substrate from the support substrate in the final step is now being used as means for manufacturing a display device by a conventional manufacturing facility.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide a method for manufacturing a display device which prevents damage to a thin film transistor upon separating a polymer substrate or ultrathin glass substrate from a support substrate, lowers processing costs, and can separate them from each other within a short time.

An embodiment provides a method for manufacturing a display device, and the method includes steps of forming a deformed layer on a support substrate by a silane coupling agent; performing UV treatment on the deformed layer; forming a thin film substrate on the deformed layer; forming a pixel and an encapsulation member on the thin film substrate; and separating the support substrate from the thin film substrate.

The formation of a pixel includes at least one process step which is carried out at a temperature of 300° C. or higher.

The formation of a pixel includes: forming a polysilicon layer on the thin film substrate; forming a semiconductor layer having source and drain regions by doping the polysilicon layer with conductive impurity ions; and activating the conductive impurity ions. The activation may be carried out at a temperature of 300° C. or higher.

The method may further include performing heat treatment on the deformed layer after the UV treatment.

The heat treatment may be carried out at a temperature of 300° C. or higher.

The heat treatment may be carried out at a temperature of 300° C. to 450° C.

The heat treatment may be carried out for 30 minutes to 1 hour.

The silane coupling agent may be represented by the following Chemical Formula 1:

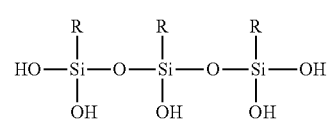

[Chemical Formula 1]

(R is an alkyl group having 1 to 20 carbon atoms)

The deformed layer may be formed at a thickness of 1 μm all to 3 μm.

The UV treatment may be carried out for 10 to 30 minutes.

The thin film substrate may include either a polymer substrate or thin film glass substrate including at least one selected from the group consisting of polyimide, polycarbonate, polyacrylate, polyetherimide, polyethersulfone, polyethylene terephthalate, and polyethylene naphthalate.

The thin film glass substrate may have a thickness of 50 μm to 200 μm.

In the formation of a thin film substrate, the thin film substrate may be a polymer substrate, and the polymer substrate may undergo a dehydration step.

The dehydration step may be carried out at a temperature of 300° C. or higher.

The pixel may include an organic light emitting diode.

By forming a flexible display device according to the present invention, no thermal or mechanical damage is inflicted on thin film transistors and light emitting diodes of a display panel when the support substrate and the display panel are separated from each other.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
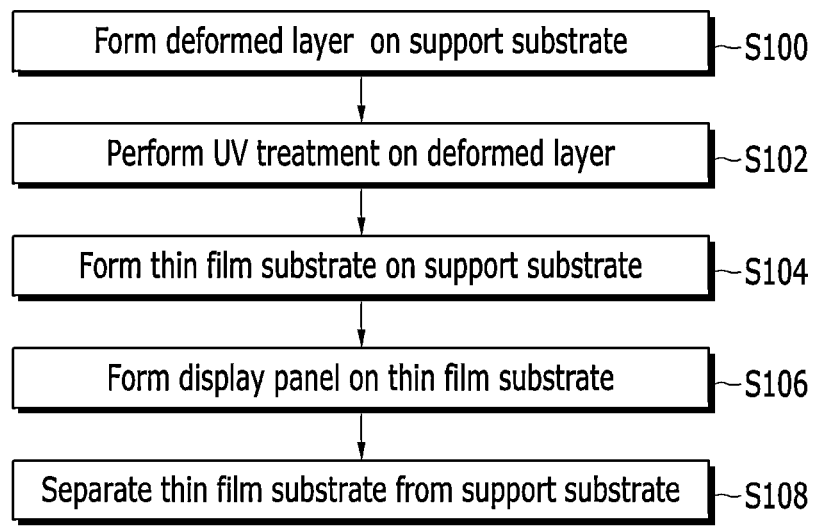
FIG. 1 is a flow chart showing a method for manufacturing a display device according an embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Throughout the specification, when it is described that one element such as a layer, a film, an area, a plate, etc. is formed on another element, it means that one element exists right on another element or that one element exists on another element with a further element therebetween. In contrast, when an element is referred to as being "directly on" another element, there are no intervening elements present.

FIG. 1 is a sequential view showing a method for manufacturing a display device according an embodiment.

As shown in FIG. 1, a method for manufacturing a display device according to the present invention includes the step S100 of forming a deformed layer on a support substrate, the step S102 of performing UV treatment on the deformed layer, the step S104 of forming a thin film substrate, the step S106 of forming a pixel including a thin film transistor on the thin film substrate, and the step S108 of separating the thin film substrate from the support substrate.

The method for manufacturing a display device will now be described in further detail with reference to FIGS. 2 through 6 according to the sequential view of FIG. 1.

FIG. 2 through FIG. 5 are cross-sectional views for explaining a method for manufacturing a display device according to an embodiment. FIG. 6 is a schematic layout view of a display device according to an embodiment.

Figure 2:
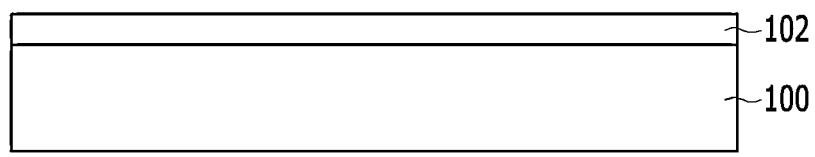
FIG. 2 through FIG. 5 are cross-sectional views for explaining a method for manufacturing a display device according to an embodiment.

As shown in FIG. 2, a support substrate 100 is prepared, and a deformed layer 102 is formed on the support substrate 100 (S100).

The support substrate 100 is adapted to prevent a thin film substrate from being bent due to its thin profile and support it, and it may be a solid glass substrate.

The deformed layer 102 is a layer for facilitating the separation of the thin film substrate, and may be formed by spin coating. The deformed layer 102 is a material which is decomposable at a low temperature of 150° C. to 300° C.; for example, a silane coupling agent represented by the following Chemical Formula 1. The deformed layer 102 is formed at a thickness of 1 μm to 3 μm.

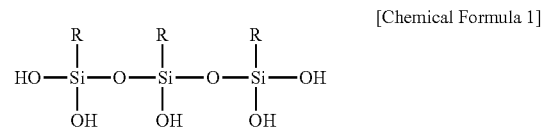

[Chemical Formula 1]

(R is an alkyl group having 1 to 20 carbon atoms)

Afterwards, UV treatment is performed on the deformed layer 102. The UV treatment may be carried out for 10 to 30 minutes.

With the UV treatment, the OH group of the deformed layer is activated, and increases the coupling force between the thin film substrate 110 positioned on the deformed layer 102 and the deformed layer 102.

Figure 3:
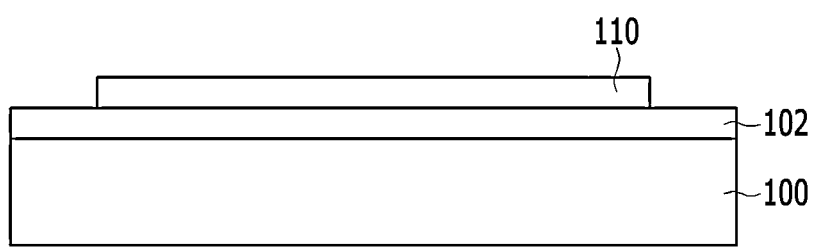

Next, as shown in FIG. 3, the thin film substrate 110 is positioned on the deformed layer 102. The thin film substrate 110 may be a polymer substrate made of a polymer material or an ultrathin glass substrate.

The polymer substrate may be formed by applying and thermally curing a liquid polymer material, and may be made of polyimide, polycarbonate, polyacrylate, polyetherimide, polyethersulfone, polyethylene terephthalate, or polyethylene naphthalate. Polyimide can be used at a high process temperature of 450° C., and therefore minimizes degradation of the characteristics of a thin film transistor in the fabrication of the thin film transistor.

A polymer substrate bends or stretches by heat so it is difficult to precisely form a thin film pattern including a thin film transistor, a light emitting element, and a conductive wire on the polymer substrate; whereas a thin glass substrate may be bent due to its small thickness of 50 μm to 200 μm or damaged when being moved. Accordingly, a subsequent process is carried out after positioning the thin film substrate 110 on the support substrate 100.

Figure 4:
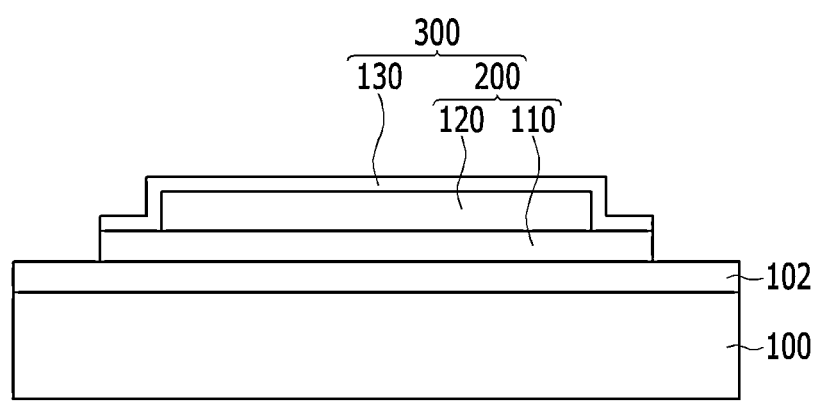

Next, as shown in FIG. 4, a display panel 300 including a plurality of pixels 120 and an encapsulation member 130 is formed on the thin film substrate 110. The display panel 300 includes an organic light emitting substrate 200 including the thin film substrate 110 and the pixels 120 and the encapsulation member 130 covering the pixels 120.

As shown in FIG. 6, the pixels 120 may be formed on the thin film substrate, and arranged in a matrix.

In reference to FIG. 6, the organic light emitting substrate includes a display section PA and a peripheral section PB.

The display part includes first signal lines 21 formed in one direction and transmitting a scan signal, second signal lines 71 crossing the first signal lines 21 and transmitting an image signal, and pixels 120 connected to the first signal lines 21 and the second signal lines 71 to display an image, and arranged in a matrix. The pixels may further include various types of signal lines to which other signals are applied, in addition to the first signal lines and the second signal lines.

Each pixel 120 includes a thin film transistor for receiving a signal from the first signal lines 21 and the second signal lines 71 and displaying an image and an organic light emitting diode.

The organic light emitting diode is controlled by a driver, and emits light in response to a drive signal to display an image.

The peripheral section PB includes drivers 510 connected to the first signal lines 21 or second signal lines 71 to transmit an external signal thereto. The drivers 510 may be IC chips which are mounted on the thin film substrate or integrated on the substrate, together with the transistors of the display section.

FIG. 4 schematically illustrates the pixels 120 as being a layer for better understanding and ease of description.

The encapsulation member 130 may consist of a plurality of layers, may include at least one of an inorganic film and an organic film, and may be laminated every other layer. The inorganic film may include an aluminum oxide or a silicon oxide, and the organic film may include epoxy, acrylate, or urethane acryulate.

The inorganic film prevents external moisture and oxygen from penetrating into the light emitting element. The organic film serves to alleviate internal stress of the inorganic film or fill fine cracks and pinholes in the inorganic film. The constituent materials of the above-mentioned inorganic and organic films are merely illustrative and not limiting, and various types of inorganic and organic films known to those skilled in the art can be used.

The encapsulation member 130 covers the pixels to prevent them from being exposed to the exterior.

A barrier film (not shown) may be interposed between the encapsulation member 130 and the thin film substrate 110. The barrier film prevents unnecessary elements such as moisture or oxygen from entering the pixels 120. The barrier film may include at least one of the organic film and the inorganic film, and may be laminated every other layer.

Figure 5:
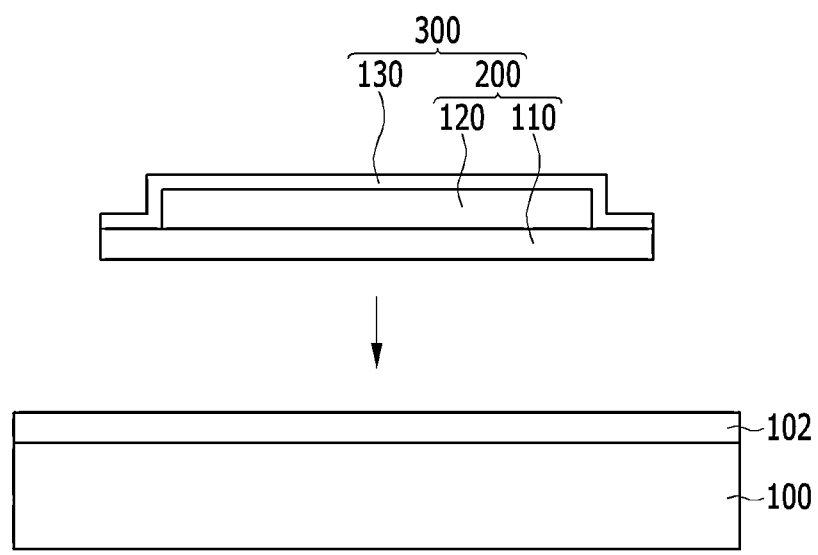
Figure 6:
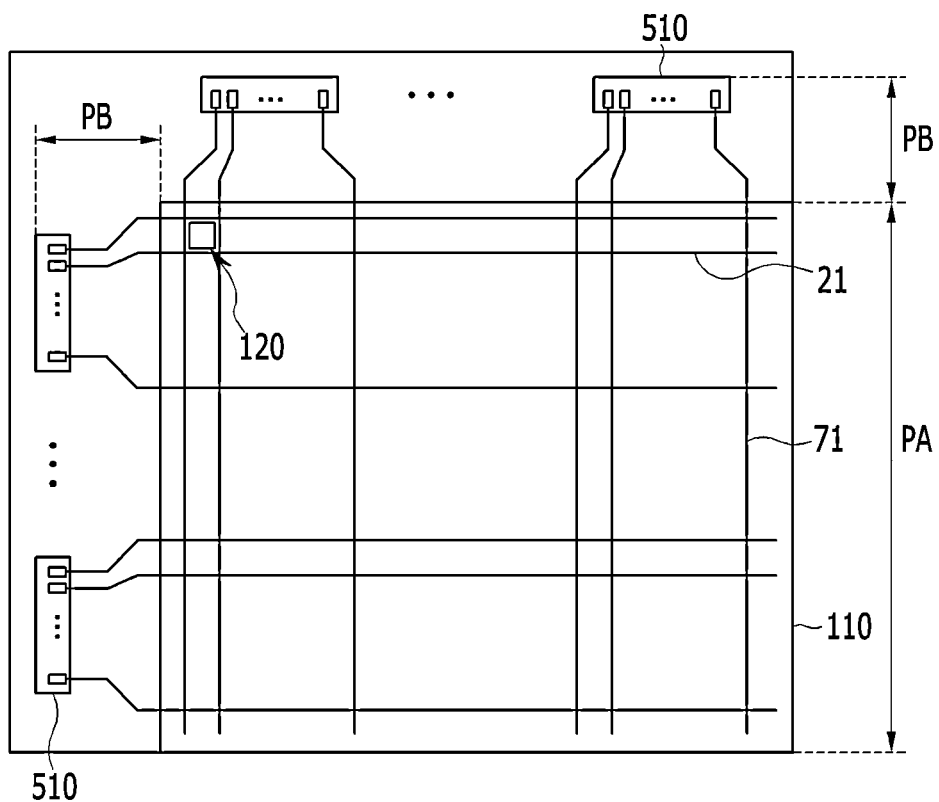
FIG. 6 is a schematic layout view of a display device according to an embodiment.

Next, as shown in FIG. 5, the support substrate 100 is separated from the thin film substrate 110 to free the display panel 300.

The deformed layer 102 enables the support substrate 100 to be easily separated from the thin film substrate 110 with hands.

A process of forming circuits such as thin film transistors of pixels as shown in FIG. 4 includes a plurality of process steps, such as a dehydration step, an impurity activation step, and a crystallization step, which are carried out at a temperature of at least 300° C. or higher.

Before carrying out this process, the thin film substrate 110 and the deformed layer 102 are firmly secured together, so that the deformed layer 102 is not easily separated from the thin film substrate 110. In an embodiment, however, a silane coupling agent, which is easily decomposable because the length of a polymer chain is short, is used as the deformed layer to make it easy to generate bubbles even at a low temperature of around 300° C.

Accordingly, bubbles are generated in the deformed layer 102 during the formation process of the pixels 120, including the process steps carried out at a temperature of 300° C. or higher, and the bubbles weaken the coupling force between the deformed layer 102 and the thin film substrate 110, thereby making it easy to separate the thin film substrate 110 and the support substrate 100 from each other.

Although the foregoing explanation has been made on a display device including an organic light emitting diode, each pixel of FIG. 6 may include liquid crystals, instead of the organic light emitting diode. A liquid crystal display device in which each pixel includes liquid crystals includes an opposite substrate which has no encapsulation member and faces the thin film substrate with liquid crystals interposed therebetween.

Hereinafter, the pixels will be described in further detail with reference to FIGS. 7 through 9.

Figure 7:
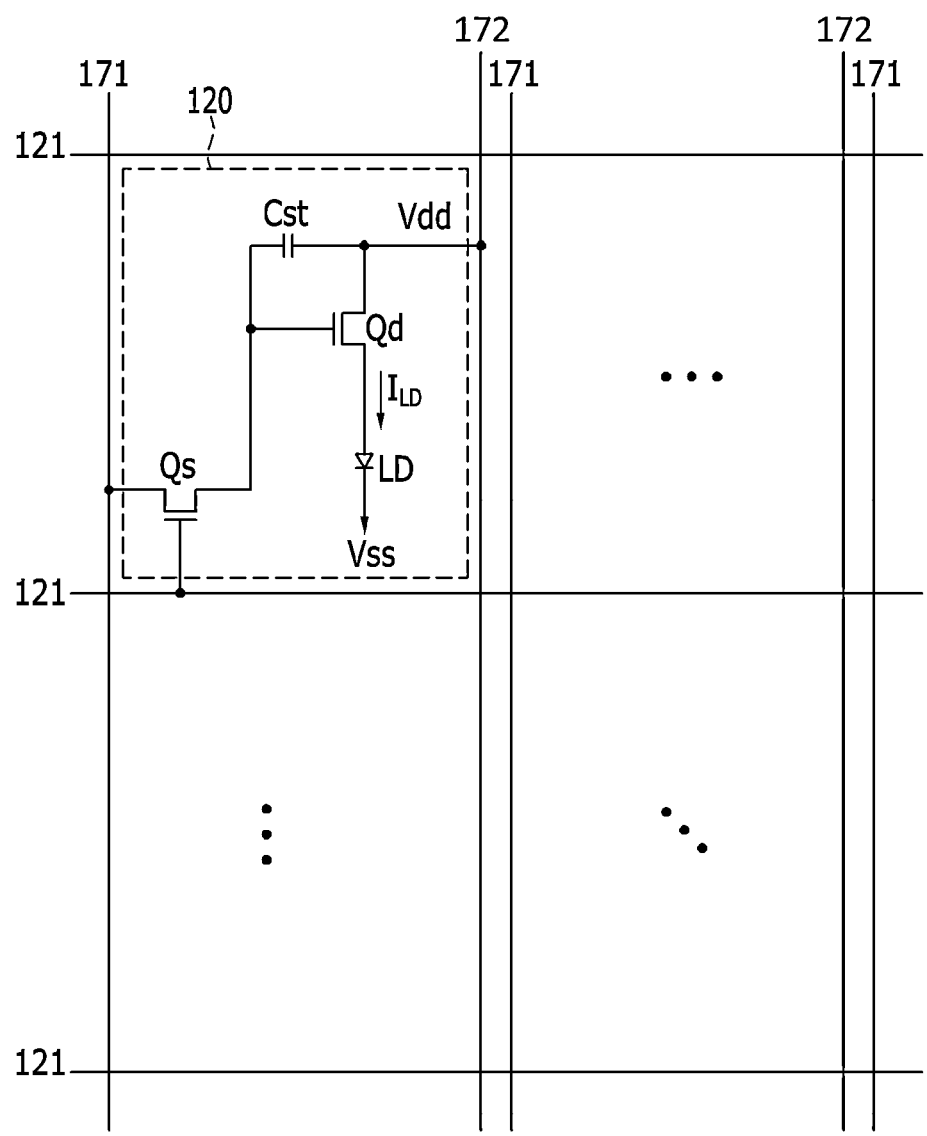
FIG. 7 is an equivalent circuit diagram showing a pixel of a display device according to an embodiment.

FIG. 7 is an equivalent circuit diagram showing a pixel of a display device according to an embodiment.

As shown in FIG. 7, a display device according to an embodiment includes a plurality of signal lines 121, 171, and 172 and a plurality of pixels 120 connected to these signals and arranged substantially in a matrix.

The signal lines include a plurality of gate lines 121 that transmit gate signals (or scan signals), a plurality of data lines 171 that transmit data signals, and a plurality of driving voltage lines 172 that transmit a driving voltage Vdd. The gate lines 121 extend in a row direction and are substantially parallel to each other. Vertical regions of the data lines 171 and the driving voltage lines 172 extend in a column direction and are substantially parallel to each other.

Each pixel PX includes a switching transistor Qs, a driving transistor Qd, a storage capacitor Cst, and an organic light emitting diode (OLED) LD.

The switching transistor Qs includes a control terminal, an input terminal, and an output terminal. The control terminal is connected to the gate lines 121, the input terminal is connected to the data lines 171, and the output terminal is connected to the driving transistor Qd, respectively. The switching transistor Qs transmits data signals received from the data lines 171 to the driving transistor Qd in response to a scan signal from the gate lines 121.

The driving transistor Qd also has a control terminal, an input terminal, and an output terminal. The control terminal is connected to the switching transistor Qs, the input terminal is connected to the driving voltage lines 172, and the output terminal is connected to the organic light emitting diode LD. The driving thin film transistor Qd flows an output current $I_{LD}$ whose magnitude varies depending on a voltage between the control terminal and the output terminal thereof.

The storage capacitor Cst is connected between the control terminal and the input terminal of the driving thin film transistor Qd. The storage capacitor Cst charges the data signal applied to the control terminal of the driving thin film transistor Qd and maintains the charge of the data signal after the switching thin film transistor Qs is turned off.

The organic light emitting diode LD includes an anode connected to the output terminal of the driving thin film transistor Qd and a cathode connected to a common voltage Vss. The organic light emitting diode LD emits light that is varied in intensity in dependence upon the output current $I_{LD}$ of the thin film transistor Qd to display an image.

Hereinafter, an organic light emitting diode display device according to an embodiment will be described in detail with reference to FIGS. 8 and 9.

Figure 8:
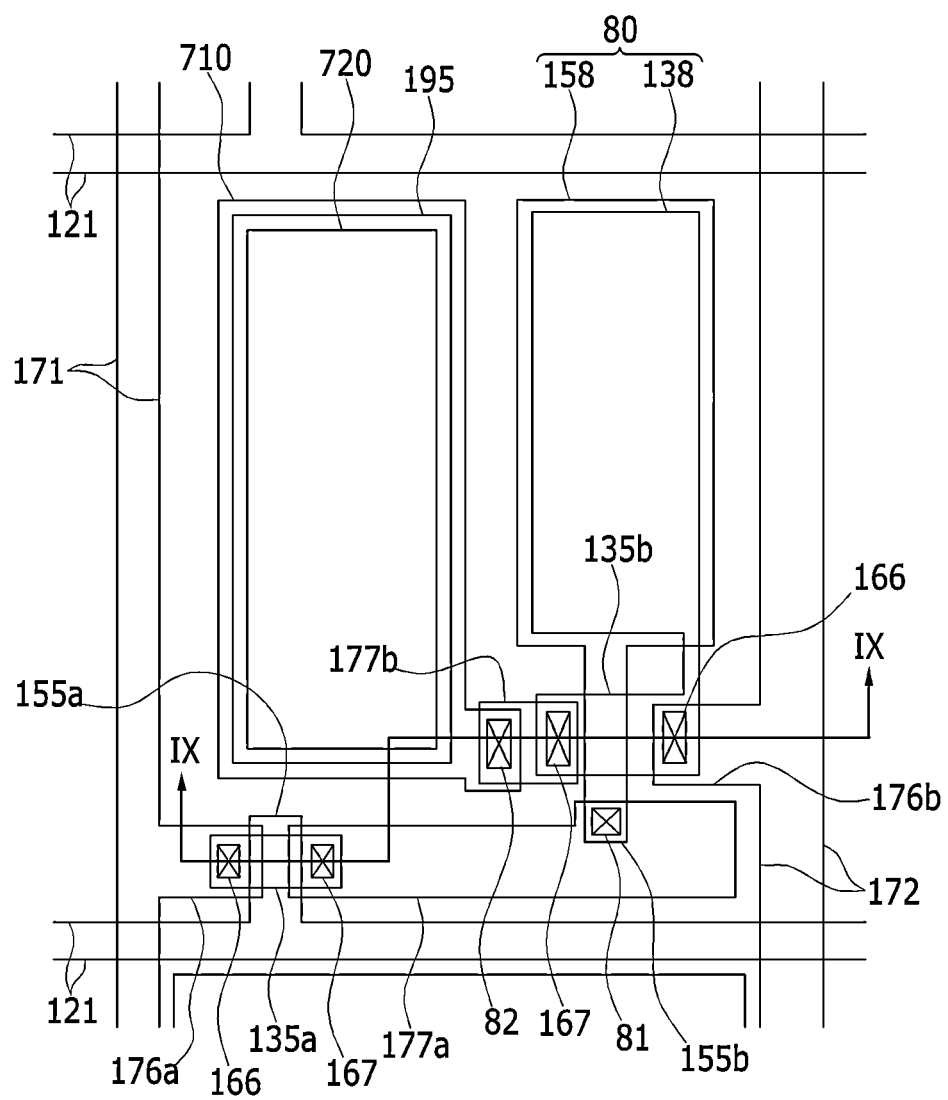
FIG. 8 is a layout view of a pixel of the organic light emitting diode display device of FIG. 7.
Figure 9:
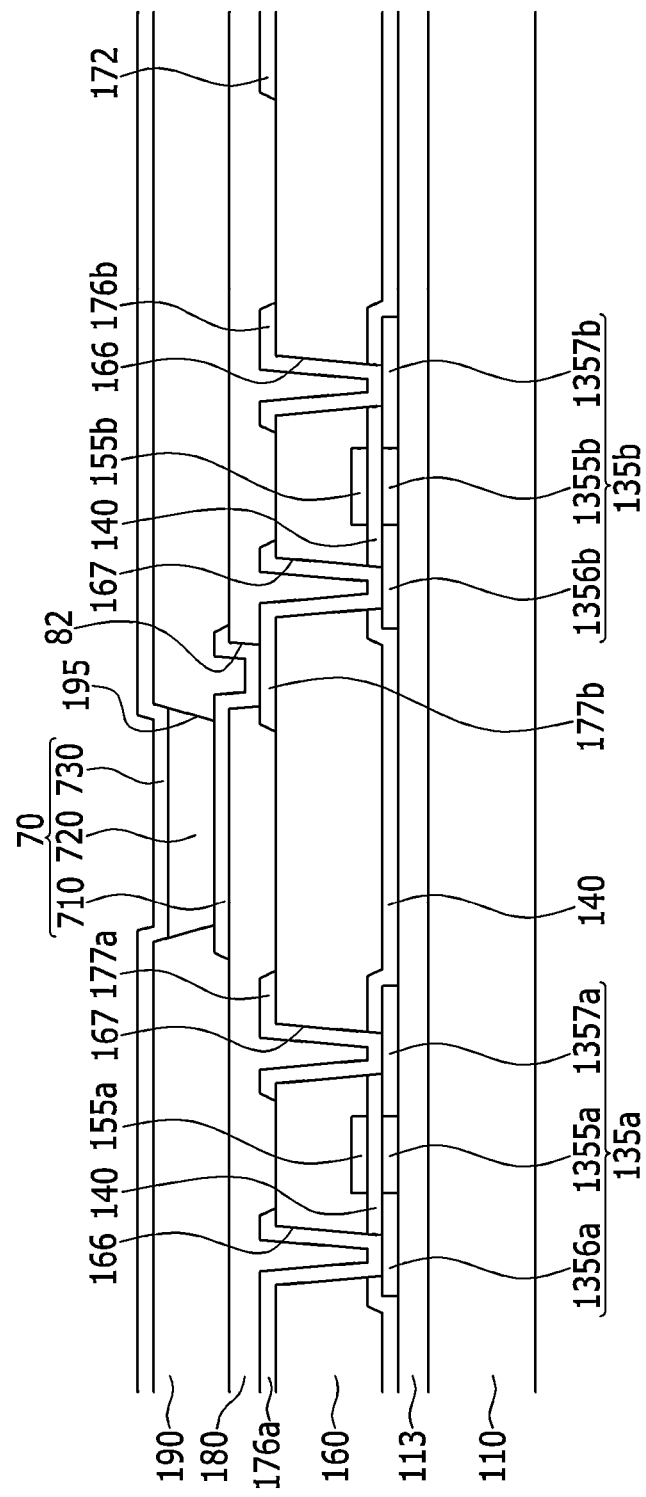
FIG. 9 is a cross-sectional view taken along line IX-IX of FIG. 8.

FIG. 8 is a layout view of a pixel of the organic light emitting diode display device of FIG. 7, and FIG. 9 is a cross-sectional view taken along line IX-IX of FIG. 8.

As shown in FIG. 8 and FIG. 9, a buffer layer 113 is formed on the thin film substrate 110.

The thin film substrate 110 may be a polymer substrate made of a polymer material or an ultrathin glass substrate. The buffer layer 113 may have a single-layer structure of silicon nitride (SiNx), or a dual-layer structure of silicon nitride (SiNx) and silicon oxide ($SiO_2$) laminated therein. The buffer layer 113 serves to prevent penetration of unnecessary elements such as an impurity or moisture and planarize the surface.

First and second semiconductor layers 135a and 135b made of polysilicon and a first capacitor electrode 138 are formed on the buffer layer 113.

The first semiconductor layer 135a and the second semiconductor layer 135b each may be divided into a channel region 1355a and 1355b and a source region 1356a and 1356b and a drain region 1357a and 1357b which are formed on both sides of the channel region 1355a and 1355b. The channel regions 1355a and 1355b of the first and second semiconductor layers 135a and 135b are polysilicon that is not doped with an impurity, i.e., intrinsic semiconductor. The source regions 1356a and 1356b and drain regions 1357a and 1357b of the first and second semiconductor layers 135a and 135b are polysilicon doped with an impurity, i.e., impurity semiconductor.

The impurity doped in the source regions 1356a and 1356b, drain regions 1357a and 1357b, and first capacitor electrode 138 may be either a P-type impurity or an N-type impurity.

A gate insulating layer 140 is formed on the first semiconductor layer 135a, the second semiconductor layer 135b, and the first capacitor electrode 138. The gate insulating layer 140 may be formed as a single layer or multiple layers, including one or more of tetraethylorthosilicate (TEOS), silicon nitride (SiNx), and silicon oxide ($SiO_2$).

A gate line 121 extends longitudinally in a horizontal direction to transmit gate signals, and includes a first gate electrode 155a protruding toward the first semiconductor layer 135a from the gate line 121.

The first gate electrode 155a and a second gate electrode 155b overlap the channel regions 1355a and 1355b, respectively, and a second capacitor electrode 158 overlaps the first capacitor electrode 138.

The second capacitor electrode 158, the gate line 121, and the second gate electrode 155b may be formed as a single layer or multiple layers of a low-resistance material or high corrosion-resistance material, such as Al, Ti, Mo, Cu, Ni, or an alloy thereof.

The first capacitor electrode 138 and the second capacitor electrode 158 constitute a capacitor 80 by using the gate insulating layer 140 as a dielectric material. The capacitor 80 may be an MIM-type capacitor having a metal pattern overlapping the second capacitor electrode 158, instead of the first capacitor electrode 138, with an insulating layer interposed therebetween. For example, the capacitor 80 may be formed of a metal pattern that is formed on the same layer as a drain electrode or first electrode and overlaps the second capacitor electrode 158 by using a first interlayer insulating layer or second interlayer insulating layer to be described later as a dielectric material.

A first interlayer insulating layer 160 is formed on the gate line 121, the second gate electrode 155b, and the second capacitor electrode 158.

The first interlayer insulating layer 160 may be formed as a single layer or multiple layers, including tetraethylorthosilicate (TEOS), silicon nitride (SiNx), or silicon oxide ($SiO_2$), like the gate insulating layer 140.

A source contact hole 166 exposing the source regions 1356a and 1356b and a drain contact hole 167 exposing the drain regions 1357a and 13557b are formed in the first interlayer insulating layer 160 and the gate insulating layer 140.

A data line 171 having a first source electrode 176a, a driving voltage line 172 having a second source electrode 176b, a first drain electrode 177a, and a second drain electrode 177b are formed on the first interlayer insulating layer 160.

The data line 171 transmits a data signal and extends in a direction crossing the gate line 121, and the driving voltage line 172 transmits a given voltage, is separated from the data line 172, and extends in the same direction as the data line 171.

The first source electrode 176a protrudes toward the first semiconductor layer 135a from the data line 171, and the second source electrode 176b protrudes toward the second semiconductor layer 135b from the driving voltage line 172.

The first source electrode 176a and the second source electrode 176b are respectively connected to the source regions 1356a and 1356b through the source contact hole 166.

The first drain electrode 177a faces the first source electrode 176a, and is connected to the drain region 1357a through the contact hole 167. The second drain electrode 177b faces the first source electrode 176b, and is connected to the drain region 1357b through the contact hole 167.

The first drain electrode 177a extends along the gate line, and is electrically connected to the second gate electrode 155b through a contact hole 81.

The data line 171, the driving voltage line 172, the first drain electrode 177a, and the second drain electrode 177b may be formed as a single layer or multiple layers of a low-resistance material or high corrosion-resistance material, such as Al, Ti, Mo, Cu, Ni, or an alloy thereof. For example, they may be a triple layer of Ti/Cu/Ti, Ti/Ag/Ti, or Mo/Al/Mo.

The first gate electrode 155a, the first source electrode 176a, and the first drain electrode 177a, together with the first semiconductor layer 135a, constitute a first thin film transistor (TFT) Qa, and the second gate electrode 155b, the second source electrode 176b, and the second drain electrode 177b, together with the second semiconductor layer 135b, constitute a second thin film transistor Qb.

A channel of the first thin film transistor Qa is formed in the first semiconductor layer 135a between the first source electrode 176a and the first drain electrode 176a, and a channel of the second thin film transistor Qb is formed in the second semiconductor layer 135b between the second source electrode 176b and the second drain electrode 177b.

A second interlayer insulating layer 180 is formed on the data line 171, the driving voltage line 172, the first drain electrode 177a, and the second drain electrode 177b.

The second interlayer insulating layer 180 may be formed as a single layer or multiple layers, including tetraethylorthosilicate (TEOS), silicon nitride (SiNx), or silicon oxide ($SiO_2$), like the first interlayer insulating layer, and may be made of a low-dielectric constant organic material.

A contact hole 82 exposing the second drain electrode 177b is formed in the second interlayer insulating layer 180.

A first electrode 710 is formed in the second interlayer insulating layer 180. The first electrode 710 may be an anode of the organic light emitting diode of FIG. 1. Although an interlayer insulating layer is formed between the first electrode 710 and the second drain electrode 177b according to an embodiment, the first electrode 710 may be formed on the same layer as the second drain electrode 177b, and may be integral with the second drain electrode 177b.

A pixel definition film 190 is formed on the first electrode 710.

The pixel definition film 190 has an opening 195 exposing the first electrode 710. The pixel definition film 190 may made of resin, such as polyacrylates or polyimides, silica-based inorganic matter, or the like.

An organic emission layer 720 is formed within the opening 195 of the pixel definition film 190.

The organic emission layer 720 has a multilayer structure, including an emission layer and one or more of a hole injection layer (HIL), a hole transporting layer (HTL), an electron transporting layer (ETL), and an electron injection layer (EIL).

In a case in which the organic emission layer 720 includes all of them, the hole injection layer (HIL) is disposed on the first electrode 710, which is the anode, and the hole transporting layer (HTL), the emission layer, the electron transporting layer (ETL), and the electron injection layer (EIL) are sequentially stacked on the hole injection layer (HIL).

A second electrode 730 is formed on the pixel definition film 190 and the organic emission layer 720.

The second electrode 730 serves as a cathode of the organic light emitting diode. Accordingly, the first electrode 710, the organic emission layer 720, and the second electrode 730 constitute an organic light emitting diode 70.

The organic light emitting diode display device has a structure of a top-emission type, a bottom-emission type, or a dual-emission type with respect to a direction in which the organic light emitting diode 70 emits light.

In a case in which the organic light emitting diode display device is the top-emission type, the first electrode 710 is formed of a reflective layer, and the second electrode 730 is formed of a semi-transmissive film or a transmissive film. Meanwhile, in a case in which the organic light emitting diode display device is the bottom-emission type, the first electrode 710 is formed of a semi-transmissive film, and the second electrode 730 is formed of a reflective layer. Furthermore, in a case in which the organic light emitting diode display device is the dual-emission type, the first electrode 710 and the second electrode 730 are formed of a transparent layer or a semi-transmissive film.

The reflective layer and the semi-transmissive film are made of at least one of metal, including magnesium (Mg), silver (Ag), gold (Au), calcium (Ca), lithium (Li), chromium (Cr), and aluminum (Al), and an alloy of them. The reflective layer and the semi-transmissive film can be determined by a thickness of the respective layers. The semi-transmissive film has a thickness of 200 nm or less. Light transmittance increases with decreasing thickness, but resistance increases if the semi-transmissive film is too thin.

The transparent film can be made of materials, such as Indium Tin Oxide (IT)), Indium Zinc Oxide (IZO), zinc oxide (ZnO), or Indium Oxide ($In_2O_3$).

Now, a method for manufacturing an organic light emitting diode display device will be described in detail with reference to FIGS. 10 through 13 and the above-explained FIGS. 8 and 9.

FIG. 10 through FIG. 13 are views showing, in the order of process steps, a method for manufacturing a display device according to an embodiment.

Figure 10:
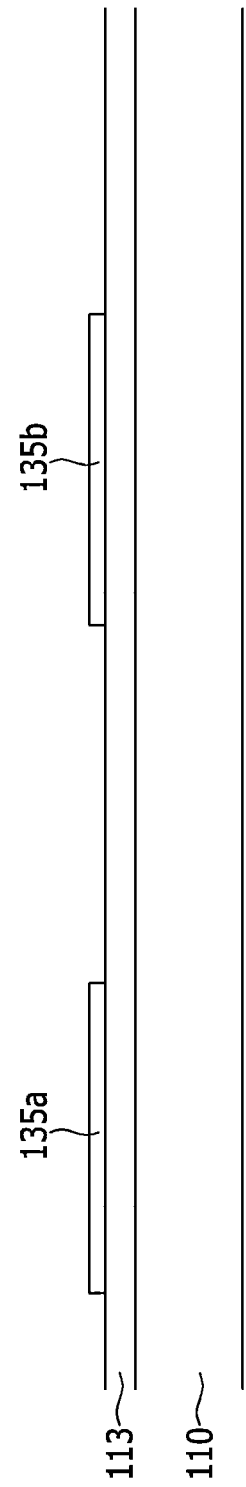
FIG. 10 through FIG. 13 are views showing, in the order of process steps, a method for manufacturing a display device according to an embodiment.

First, as shown in FIG. 10, a buffer layer 113 is formed on the thin film substrate 110. The buffer layer 113 may be formed of silicon nitride or silicon oxide.

The thin film substrate 110 may be a polymer substrate or ultrathin substrate.

The polymer substrate may be formed by applying a polymer solution on a support substrate (not shown) and then hardening it, and may undergo a dehydration step after the hardening step. The dehydration step is performed to remove bubbles and hydrogen included in the polymer substrate so as to prevent them from affecting a subsequent step. The dehydration step may be carried out for 1 hour at approximately 450° C.

An amorphous silicon film is formed on the buffer layer 113, crystallized, and then patterned to form semiconductor layers 135a and 135b.

Figure 11:
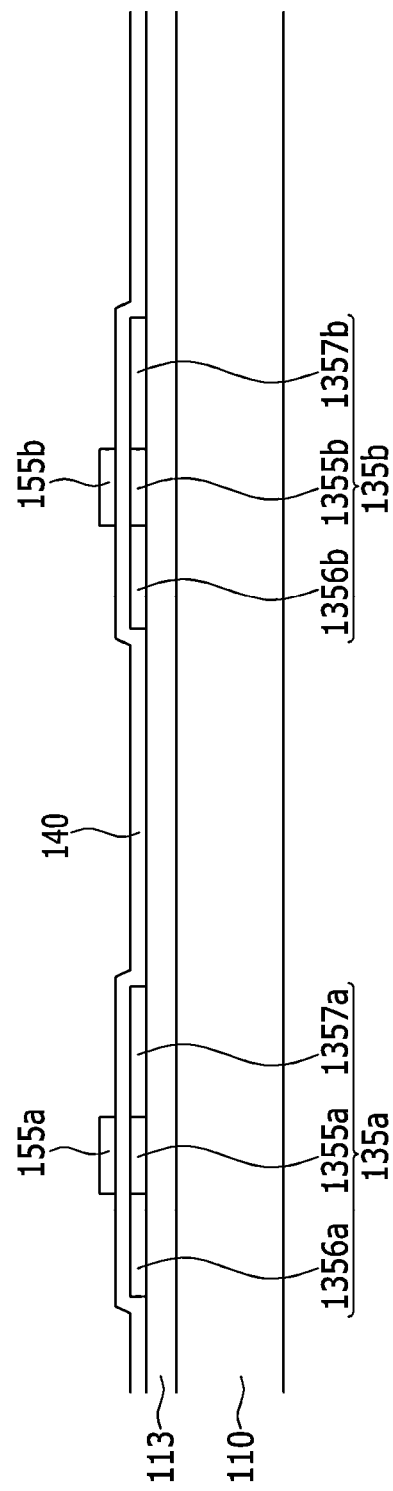

Next, as shown in FIG. 11, a gate insulating layer 140 is formed on the semiconductor layers 135a and 135b.

The gate insulating layer 140 may be formed of silicon oxide or silicon nitride at a thickness of 1,000 Å to 1,300 Å.

Next, a metal film is formed on gate insulating layer 140 and then patterned to form gate electrodes 155a and 155b.

Afterwards, the semiconductor layers 135a and 135b are doped with conductive impurity ions at a high concentration by using a gate having the gate electrodes 155a and 155b as a mask, to thereby form source regions 1356a and 1356b and drain regions 1357a and 1357b. Regions between the source regions 1356a and 1356b and the drain regions 1357a and 1357b serve as channel regions 1355a and 1355b.

Next, an activation step can be performed to activate impurity ions of the source regions and drain regions. In the activation step, heat treatment is performed for 1 hour at approximately 450° C.

Figure 12:
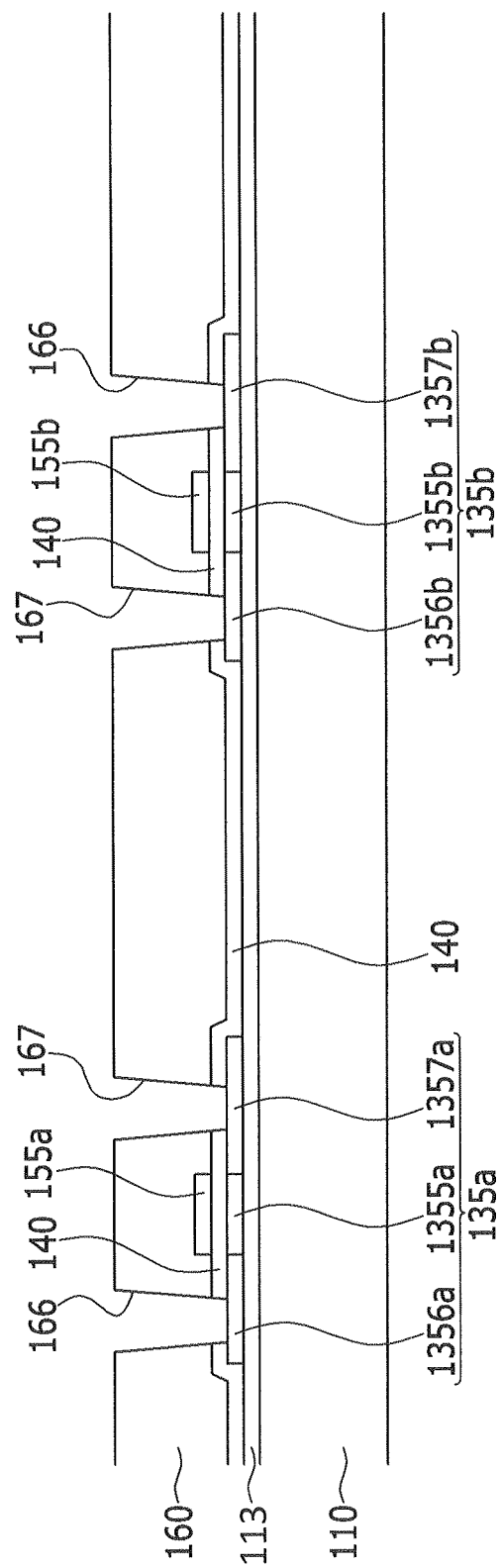

Next, as shown in FIG. 12, a first interlayer insulating layer 160 is formed on the gate electrodes 155a and 155b.

Afterwards, the first interlayer insulating layer 160 and the gate insulating layer 140 are etched to form contact holes 166 and 167 exposing the first semiconductor layer 135a and the second semiconductor layer 135b, and the first interlayer insulating layer 160 is etched to form a contact hole (not shown) exposing the second gate electrode.

Figure 13:
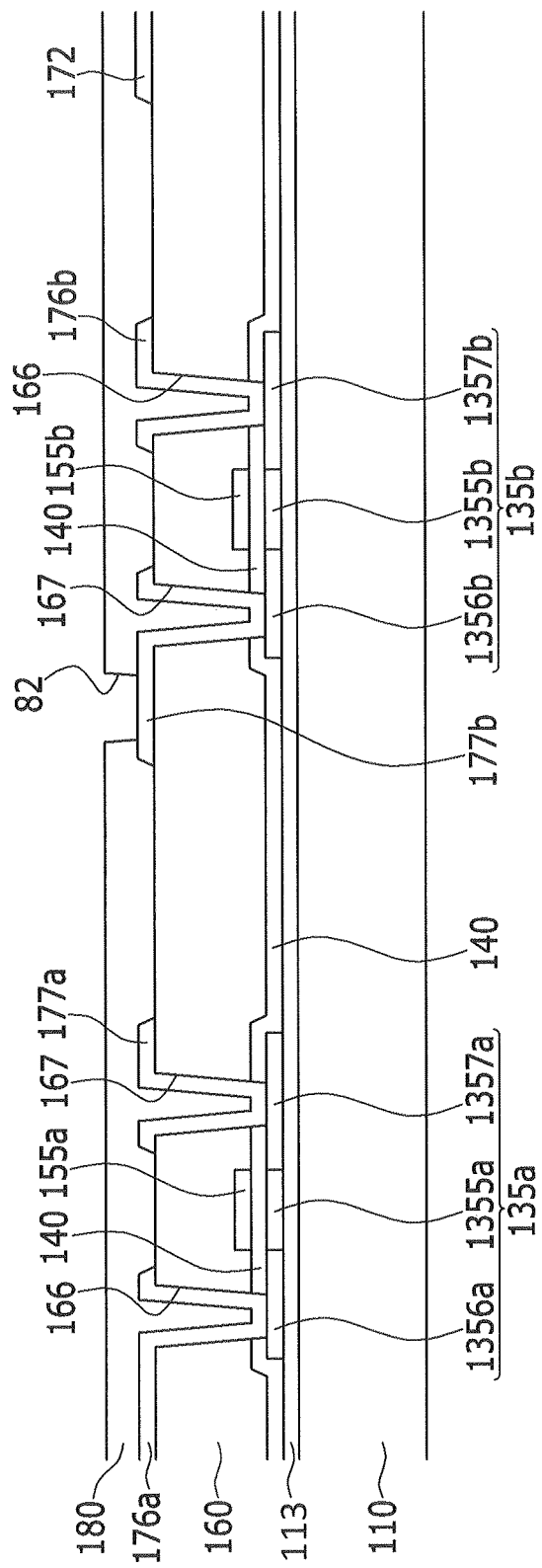

Next, as shown in FIG. 13, a metal film is formed on the first interlayer insulating layer 160 and then patterned to form a data line (not shown) having a first source electrode 176a connected to the source regions 1356a and 1356b and the drain regions 1357a and 1357b through the contact holes 166 and 167, a driving voltage line 172 having a second source electrode 176b, a first drain electrode 177a and a second drain electrode 177b.

Next, a second interlayer insulating layer 180 is formed on the data line having the first source electrode 176a, the driving voltage line 172 having the second source electrode 176b, the first drain electrode 177a, and the second drain electrode 177b.

Afterwards, the second interlayer insulating layer 180 is etched to form a contact hole 82 exposing the second drain electrode 177b.

Next, as shown in FIG. 9, a metal film is formed on the second interlayer insulating layer 180 and then patterned to form a first electrode 710.

A pixel definition film 190 having an opening 195 is formed on the first electrode, an organic emission layer 720 is formed within the opening 195 of the pixel definition film 190, and a second electrode 730 is formed on the organic emission layer.

The organic emission layer may be formed at a temperature of approximately 90° C.

Figure 14:
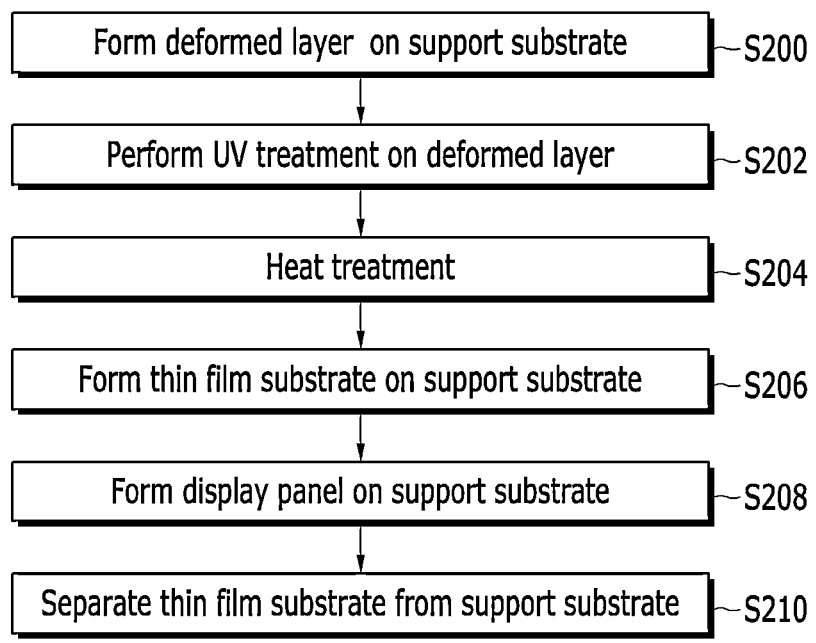
FIG. 14 is a sequential view showing a method for manufacturing a display device according to another embodiment.

FIG. 14 is a sequential view showing a method for manufacturing a display device according to another embodiment.

The method for manufacturing a display device shown in FIG. 14 is almost identical to the method for manufacturing a flexible display device shown in FIG. 1, so only the differences will be described in detail.

That is, the method for manufacturing a display device shown in FIG. 14 includes the step S200 of forming a deformed layer on a support substrate, the step S202 of performing UV treatment on the deformed layer, the step S204 of forming a thin film substrate, the step S206 of forming a pixel including a thin film transistor on the thin film substrate, and the step S208 of separating the thin film substrate from the support substrate.

The method for manufacturing a display device shown in FIG. 14 further includes the step S204 of performing heat treatment before the formation of the thin film substrate. The heat treatment step may be performed after the formation of the thin film substrate.

The heat treatment is for controlling the number of bubbles generated, and may be carried out for 30 minutes to 1 hour within the temperature range of 350° C. to 400° C.

As shown in FIG. 14, bubbles may be generated in advance and then removed by performing heat treatment. That is, it is possible to prevent an excessive amount of bubbles generated during a pixel formation step from affecting the process step by removing bubbles in advance. Preferably, there should remain enough number of bubbles required not to damage the thin film substrate upon separating the support substrate from the thin film substrate. Preferably, bubbles are distributed at a density of 23 bubbles/cm² to 28 bubbles/cm².

The number of bubbles can be controlled according to heat treatment temperature and time, as shown in Table 1.

Figure 15A:
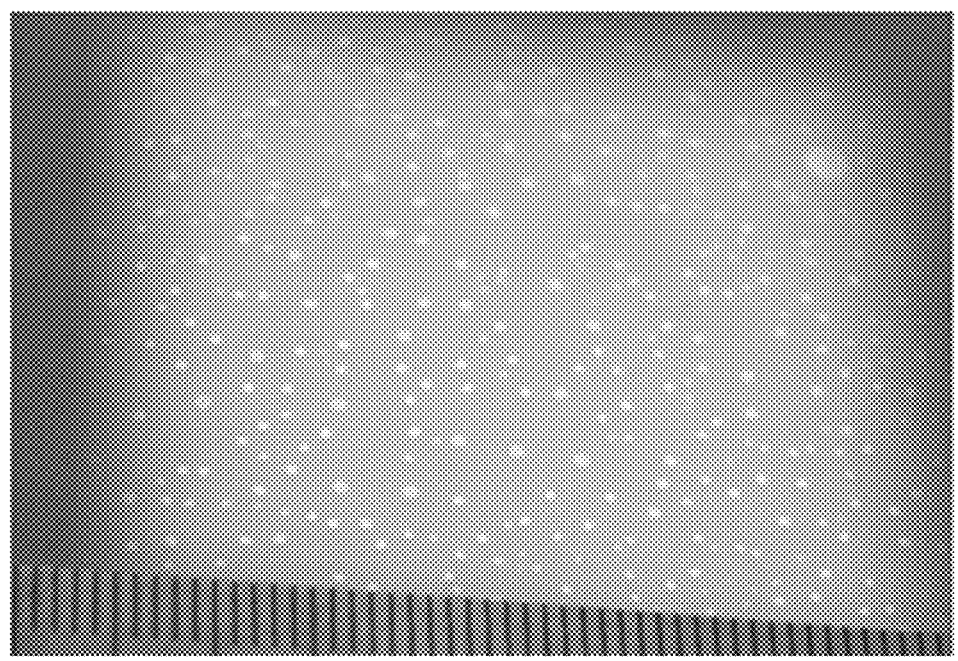
FIGS. 15A through 15C are photographs showing the state of bubbles according to Exemplary Embodiments 4 through 6 of the present invention.

Table 1 shows the measurements of the number of bubbles depending on the deformed layer of the present invention and temperature. FIGS. 15A through to 15C are photographs showing the state of bubbles according to Exemplary Embodiments 4 through 6 of the present invention.

TABLE 1

| exemplary embodiment | exemplary embodiment1 | exemplary embodiment2 | exemplary embodiment3 | exemplary embodiment4 | exemplary embodiment5 | exemplary embodiment6 |
|---|---|---|---|---|---|---|
| Process condition | 370° C. 30 mins | 400° C. 30 mins | 420° C. 30 mins | without O/G heat treatment for 1 hr at 450° C. | after O/G removal for 30 mins at 370° C. heat treatment for 1 hr at 450° C. | after O/G removal for 30 mins at 400° C. heat treatment for 1 hr at 450° C. |
| Number of bubbles per unit area (ea/cm²) | 11 | 22 | 38 | 34 | 23 | 15 |

As shown in Exemplary Embodiments 1 through 3 of Table 1, when heat treatment is performed for 30 mins at 370° C., 400° C., and 420° C., the number of bubbles is 11, 22, and 38, respectively. This shows that the number of bubbles increases with increasing temperature.

Figure 15B:
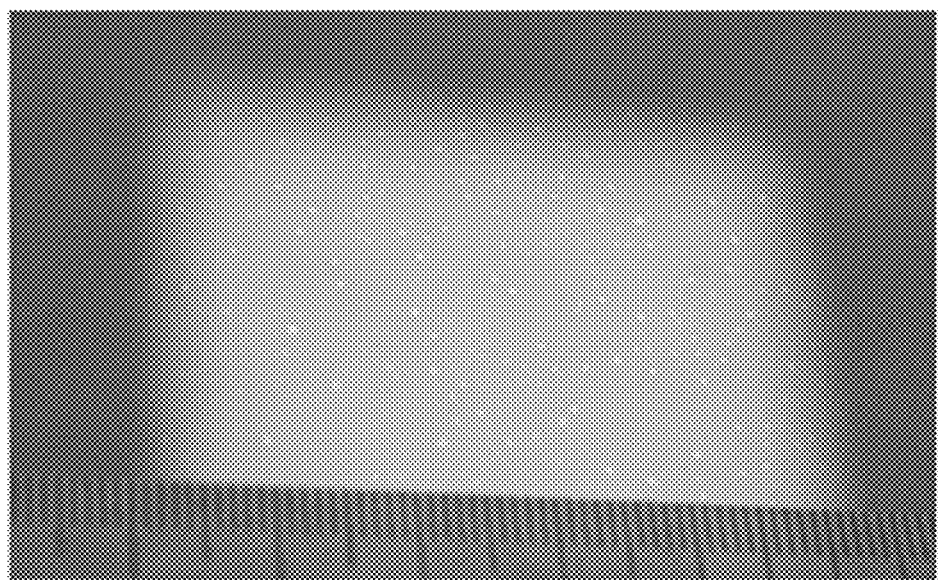
Figure 15C:
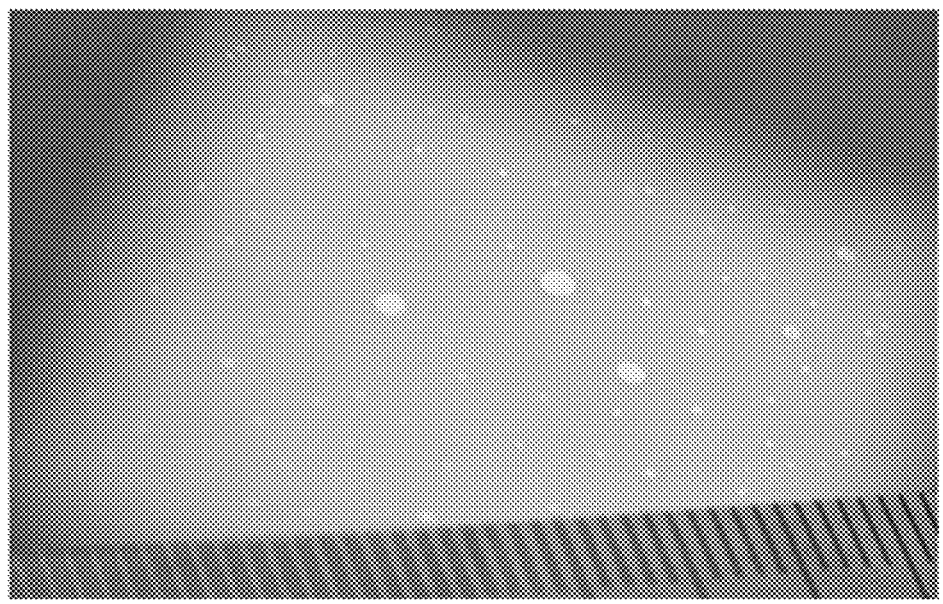

Also, it is observed that, when heat treatment is performed for 1 hour at 450° C. according to Exemplary Embodiment 4, the number of bubbles is about 34 as shown in FIG. 15A. On the other hand, it can be seen that, when heat treatment is performed for 30 mins at 370° C. and 400° C., respectively, and then heat treatment is performed for 1 hour at 450° C. at which exposure takes place during pixel formation, the number of bubbles decreases to 23 and 15, respectively, as shown in FIGS. 15B and 15C.

As seen above, the number of bubbles may increase toward a temperature at which exposure takes place during pixel formation. Accordingly, as shown in Exemplary Embodiments 5 and 6, the number of bubbles can be controlled by removing some bubbles by heat treatment so that an excessive amount of bubbles is not generated even in the pixel formation step. Therefore, an appropriate number of bubbles may be generated if necessary. In Table 1, O/G means an out gassing.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a display device, the method comprising:
    forming a separation layer on a support substrate by depositing a silane coupling agent;
    performing UV treatment on the separation layer;
    forming a thin film substrate on the separation layer;
    forming a pixel and an encapsulation member on the thin film substrate; and
    separating the support substrate from the thin film substrate by generating bubbles in the separation layer.

2. The method of claim 1, wherein the formation of the pixel comprises at least one process step which is carried out at a temperature of 300° C. or higher.

3. The method of claim 2, wherein
    the formation of the pixel comprises:
    forming a polysilicon layer on the thin film substrate;
    forming a semiconductor layer having source and drain regions by doping the polysilicon layer with conductive impurity ions; and
    activating the conductive impurity ions,
    wherein the activation is carried out at a temperature of 300° C. or higher.

4. The method of claim 1, further comprising performing heat treatment on the separation layer after the UV treatment.

5. The method of claim 4, wherein the heat treatment is carried out at a temperature of 300° C. or higher.

6. The method of claim 5, wherein the heat treatment is carried out at a temperature of 300° C. to 450° C.

7. The method of claim 4, wherein the heat treatment is carried out for 30 minutes to 1 hour.

8. The method of claim 1, wherein the silane coupling agent is represented by the following Chemical Formula 1:

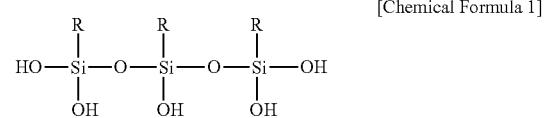

[Chemical Formula 1]

(R is an alkyl group having 1 to 20 carbon atoms).

9. The method of claim 8, wherein the separation layer is formed at a thickness of 1 μm to 3 μm.

10. The method of claim 1, wherein the UV treatment is carried out for 10 to 30 minutes.

11. The method of claim 1, wherein the thin film substrate comprises either a polymer substrate or thin film glass substrate comprising at least one selected from the group consisting of polyimide, polycarbonate, polyacrylate, polyetherimide, polyethersulfone, polyethylene terephthalate, and polyethylene naphthalate.

12. The method of claim 11, wherein the thin film glass substrate has a thickness of 50 μm to 200 μm.

13. The method of claim 11, wherein
    in the formation of the thin film substrate,
    the thin film substrate is a polymer substrate, and
    the polymer substrate undergoes a dehydration step.

14. The method of claim 13, wherein the dehydration step is carried out at a temperature of 300° C. or higher.

15. The method of claim 1, wherein the pixel comprises an organic light emitting diode.

* * * * *